(12) United States Patent
Cheng

(10) Patent No.: US 8,120,923 B2
(45) Date of Patent: Feb. 21, 2012

(54) COVER ASSEMBLY FOR INDUSTRIAL COMPUTER

(75) Inventor: Chi-Tsun Cheng, Taipei Hsien (TW)

(73) Assignee: Lif J.K. Corporation, New Taipei (TW)

( * ) Notice: Subject to any disclaimer, the term of this patent is extended or adjusted under 35 U.S.C. 154(b) by 301 days.

(21) Appl. No.: 12/636,791

(22) Filed: Dec. 14, 2009

(65) Prior Publication Data

US 2011/0141676 A1 Jun. 16, 2011

(51) Int. Cl.
  *H05K 7/16* (2006.01)
  *A47B 81/00* (2006.01)
  *A47F 7/00* (2006.01)

(52) U.S. Cl. .............. 361/727; 361/726; 312/223.1; 312/223.2; 211/26

(58) Field of Classification Search .......... 361/679.01–679.45, 679.55–679.59, 361/724–727; 312/223.1, 223.2; 211/26; 248/917–924; 411/999, 353
See application file for complete search history.

(56) References Cited

U.S. PATENT DOCUMENTS

| | | | | |
|---|---|---|---|---|
| 6,945,412 B2* | 9/2005 | Felcman et al. | ................. | 211/26 |
| 7,573,713 B2* | 8/2009 | Hoffman et al. | .............. | 361/697 |
| 7,633,760 B2* | 12/2009 | Wu et al. | ...................... | 361/727 |
| 2002/0190613 A1* | 12/2002 | Liu | ............................ | 312/223.2 |
| 2006/0220505 A1* | 10/2006 | Nakamura et al. | ......... | 312/223.2 |
| 2006/0289370 A1* | 12/2006 | Shih | ................................ | 211/26 |
| 2007/0121302 A1* | 5/2007 | Lee | ................................. | 361/726 |
| 2009/0219701 A1* | 9/2009 | Wu et al. | ...................... | 361/727 |

* cited by examiner

*Primary Examiner* — Jayprakash N Gandhi
*Assistant Examiner* — Nidhi Desai

(57) ABSTRACT

A cover assembly for industrial computer has a cover arranged to a cover body of the industrial computer or a front surface of the cover body. The cover has wide opening and screw set arranged to the opening. The screw set includes a sleeve, retaining component, and screw component. The sleeve is placed into the opening and held by a stop portion formed to the sleeve outside the cover and by the retaining component buckled to the sleeve inside the cover. An end of the sleeve outside the cover is received by a nut of the screw component. The screw component has a screw rod extending inside the cover through a tunnel of the sleeve. The wide opening allows transverse adjustment of the sleeve to be aligned with the threaded hole.

9 Claims, 6 Drawing Sheets

COVER ASSEMBLY FOR INDUSTRIAL COMPUTER

FIELD OF THE INVENTION

The present invention relates to a cover assembly, and particular to a cover assembly for an industrial computer.

DESCRIPTION OF THE PRIOR ART

Computer is known as a data processing machine by electrical components and commands thereof. The components of a computer include a display, access unit such as hard drive, power supply, mother board, and interfaces. More components such as a processor, memory module, and interface cards are adapted to the mother board. Operating system, application programs, and data are stored in the access module serve to process calculating, networking with other components. Computers are widely used for solutions of daily life nowadays.

For the need of high performance in the industrials, industrial computers and main frame are arranged by layers in a rack. Such array system is high performance and space-saving.

Prior array system has a system rack. Industrial computer terminal or main frame is received by the rack. Normally, a standard height (height U) for common array system is 1.75 inch.

Industrial computer terminal device usually has basic component like keyboard and display as input and output interfaces for users. For the purpose of space-saving and hardware protection, the industrial computer terminal device can be formed as a laptop having pivoted cover body and main body. The display is arranged to the cover body and the keyboard is arranged to the main body so that it could be lifted up for operating and folded up for storage.

For the industrial computer main frame, a cover is arranged to a front side thereof to prevent dust from coming in. While a operating and maintenance is needed, the cover can be opened by releasing screw sets on two sides of the cover.

The industrial computer usually locates in a bad environment, and manufacturing errors for metal components of the industrial computer will cause misalignment of the screws. Such misalignment will cause the industrial computer unable to be locked or secured.

SUMMARY OF THE PRESENT INVENTION

Accordingly, the primary object of the present invention is to provide a cover assembly for industrial computer. With a screw set of the invention, the cover assembly protecting the industrial computer is easily screwed and un-screwed. A wide opening design could overcome manufacturing error so that the screw sets can be screwed precisely. A quality and handling are improved by the delicate design.

Therefore, by the easy-handling screw set of the present invention, the cover body and the main body of the industrial computer will be easily lifted up, folded and well protected by the cover. The wide opening of the cover body will overcome manufacturing error so that the screw set can be screwed precisely to the threaded hole of the main body. A quality and handling are improved by the delicate design.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
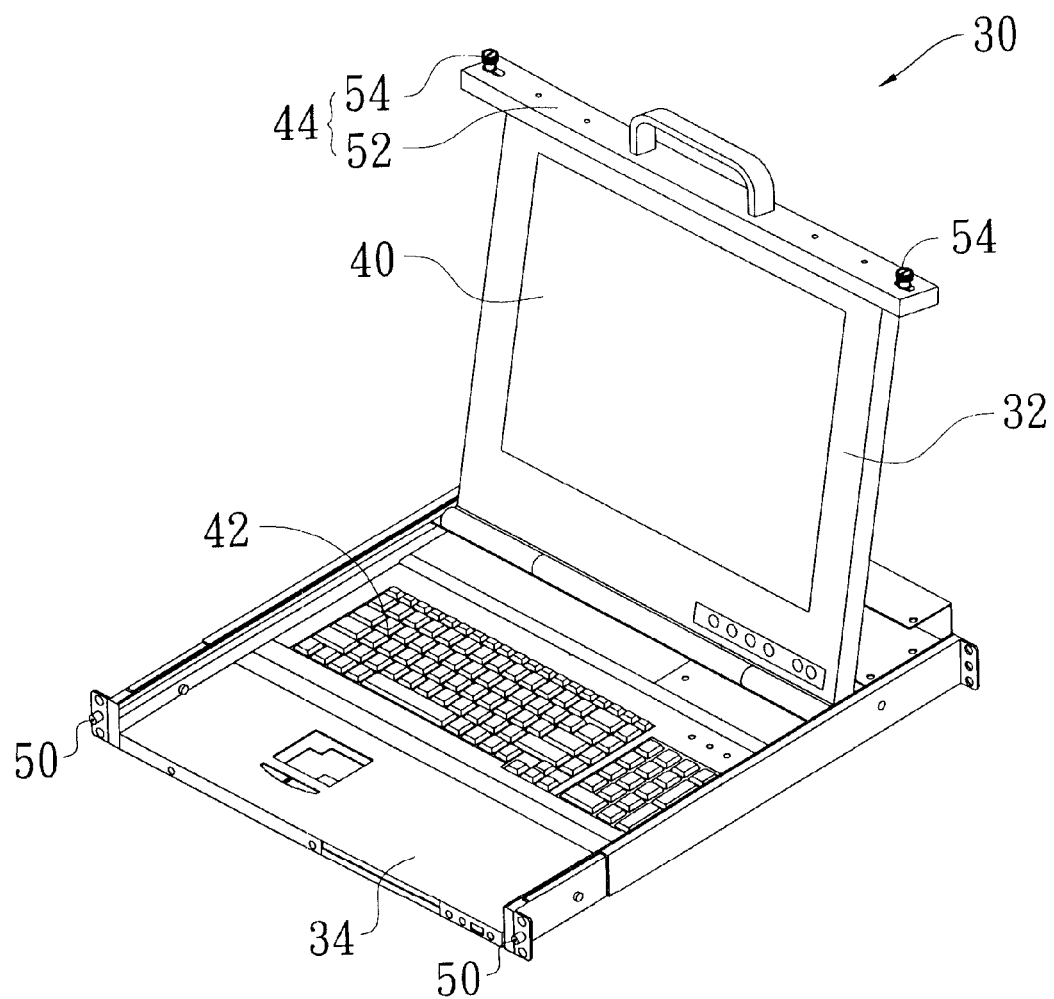
FIG. 1 is a schematic view showing an open industrial computer terminal device.

Referring to FIG. 1, a cover assembly for industrial computer according to the present invention applied to an industrial computer terminal device 30 is shown. A main body 34 and a cover body 32 pivoted to each other are revealed while the industrial computer terminal device 30 is lifted up.

A display 40 is arranged to an inner surface of the cover body 32. A keyboard 42 is arranged to an inner surface of the main body 34 opposite to the display 40 of the cover body 32. A cover assembly 44 is arranged to a front surface of the cover body 32. The cover assembly 44 has a panel 52 and two screw sets 54 on two lateral sides thereof. Two threaded holes 50 are formed to two lateral sides of a front surface of the main body 34 opposite to the screw sets 54 while the cover body 32 is folded.

Figure 2:
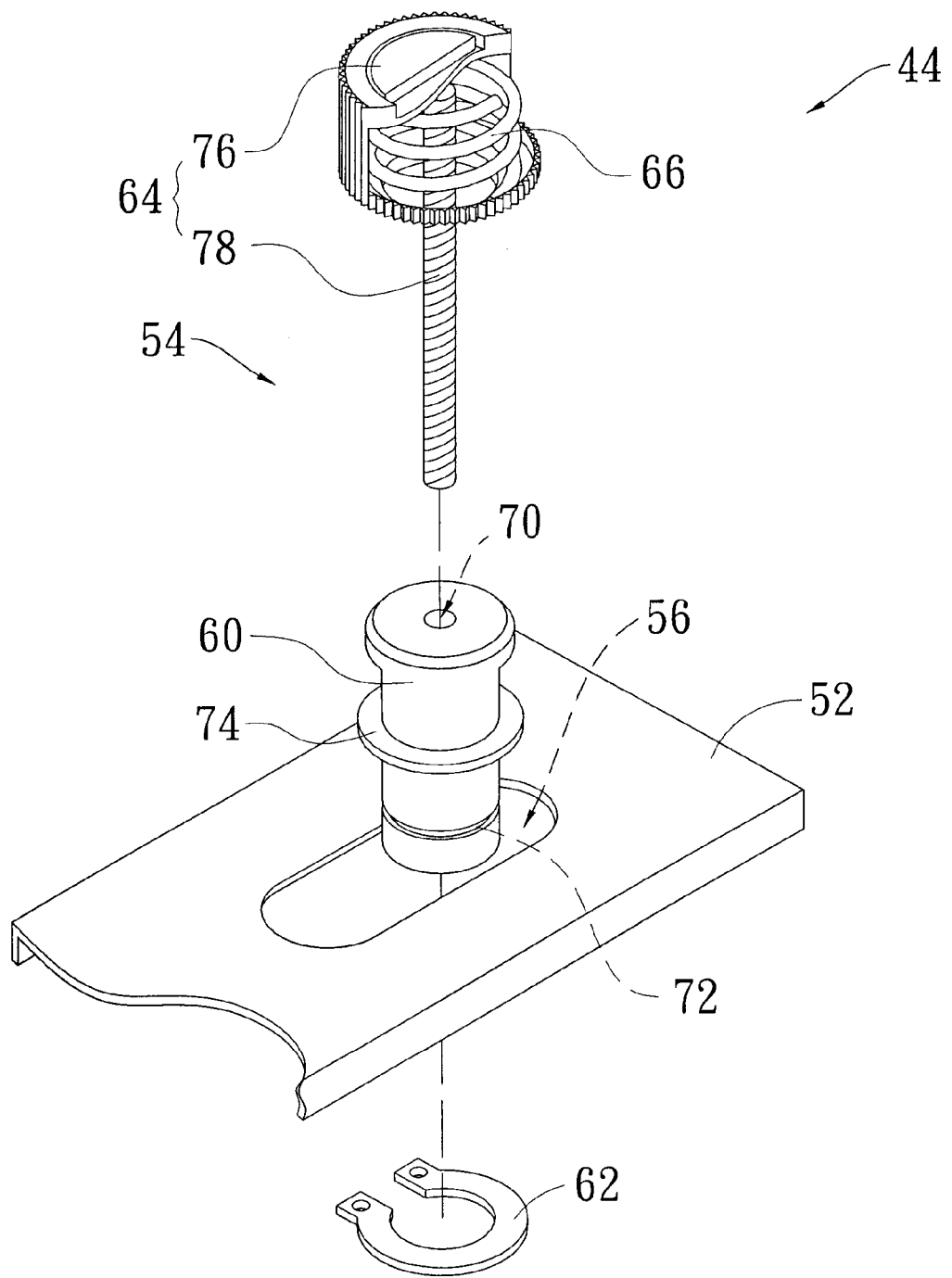
FIG. 2 is an exploded view of a cover assembly of the present invention.

Referring to FIGS. 1 and 2, the cover assembly 44 arranged to the front surface of the cover body 32 will cover the front surface of the main body 34 while the cover body 32 is folded to the main body 34. The main body 34 has at least one threaded hole 50, and the cover body 32 has a panel 52 and at least one screw set 54.

The panel 52 arranged to the front surface of the cover body 32 has oval-shape or rectangular opening 56 opposite to the threaded hole 50 of the main body 34 as shown in FIG. 2.

The screw set 54 for the opening 56 and the threaded hole 50 includes a sleeve 60, retaining component 62, screw component 64, and a spring 66. Two screw sets 54 are arranged to the two lateral sides of the cover 52 separately.

The sleeve 60 is a column and has a tunnel 70 through a center axis thereof. A stop portion 74 is extended from a round surface of the sleeve 60 such as a ring shown in FIG. 2. A groove 72 is formed to the sleeve 60 in a lower portion beneath the cover 52.

The retaining component 62 can be a C-ring. The round groove 72 can be buckled by the retaining component 62.

While assembling, the sleeve 60 is put into the opening 56 until the stop portion 74 being stopped by the rim of the opening 56, and the sleeve 60 can be fixed to the opening by buckling the retaining component 62 into the groove 72 as shown in FIG. 2.

The screw component 64 has a nut 76 and a screw rod 78. The screw rod 78 is fixed to an inner bottom of the nut 76.

Figure 3:
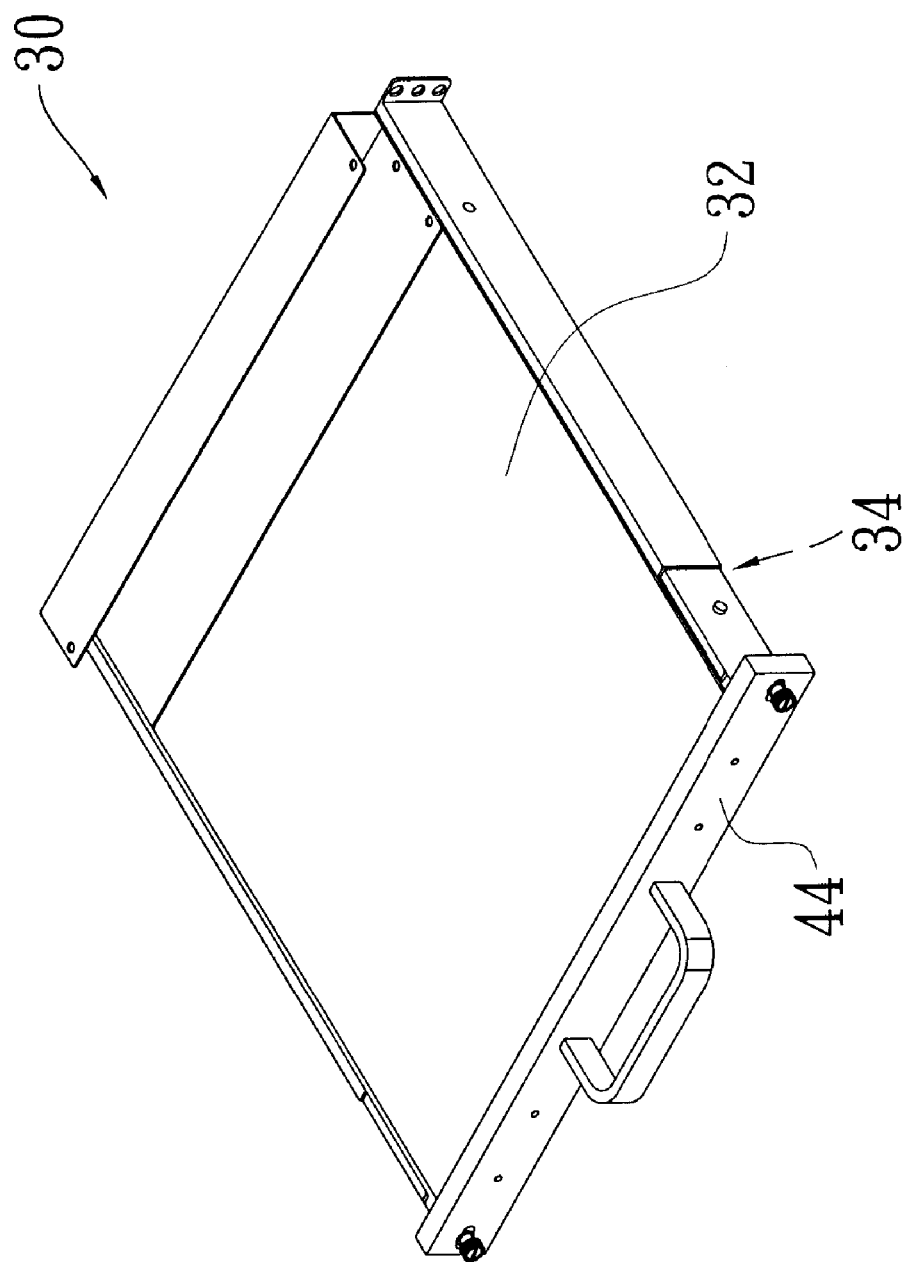
FIG. 3 is a schematic view showing a close industrial computer.

Referring to FIG. 3, the cover body 32 is folded to the main body 34. The cover assembly 44 is locked to the front surface of the main body 34 by the screw sets 54 so as to prevent dust coming into the cover body 32 and the main body 34 and to protect the front surfaces from external impact.

Figure 4:
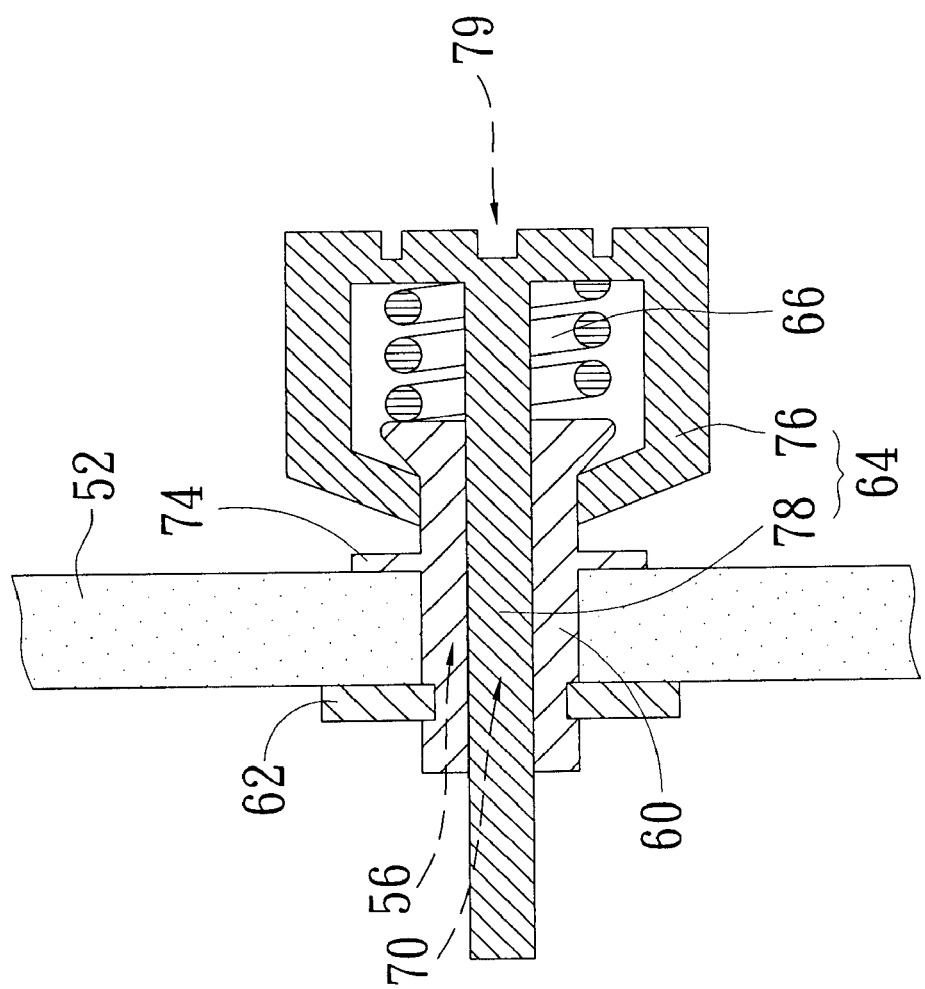
FIG. 4 is a cross section view showing a screw set of the present invention.

With reference to FIG. 4, the sleeve 60 is held to the opening 56 by stop portion 74 outside the panel 52 and the retaining ring 60 buckled to the groove 72 inside the panel 52.

The nut 76 of the screw component 64 has an inner space for receiving an end of the sleeve 60 outside the panel 52. The screw rod 78 can reach inside the panel 52 from the inner space of the nut 76 through the tunnel 70 of the sleeve 60.

With reference to FIG. 4, the end of the sleeve 60 outside the panel 52 is enlarged so as to be held by a shrunk rim of the nut 76. The spring 66 is arranged to the inner space of the nut 76 to push against the nut 76 and the sleeve 60. The screw rod 78 can be pushed further into the cover 52 with the shrink rim of the nut 76 traveling along the enlarged end of the sleeve 60 to the stop portion 74 of the sleeve 60. Moreover, the nut 76 has a recess 79 on an outer surface thereof.

By pushing the screw rod 78 towards the cover 52 with the cover body 32 folded to the main body 34, an end of the screw rod 78 can reach the threaded hole 50. The wide opening 56 allows transverse adjustment of the sleeve 60 to be aligned with the threaded hole 50. The screw rod 78 can be screwed into the threaded hole 50 by rotating the screw component 64 so that the cover assembly 44 as well as the cover body 32 will be fixed to the main body 34.

Figure 5:
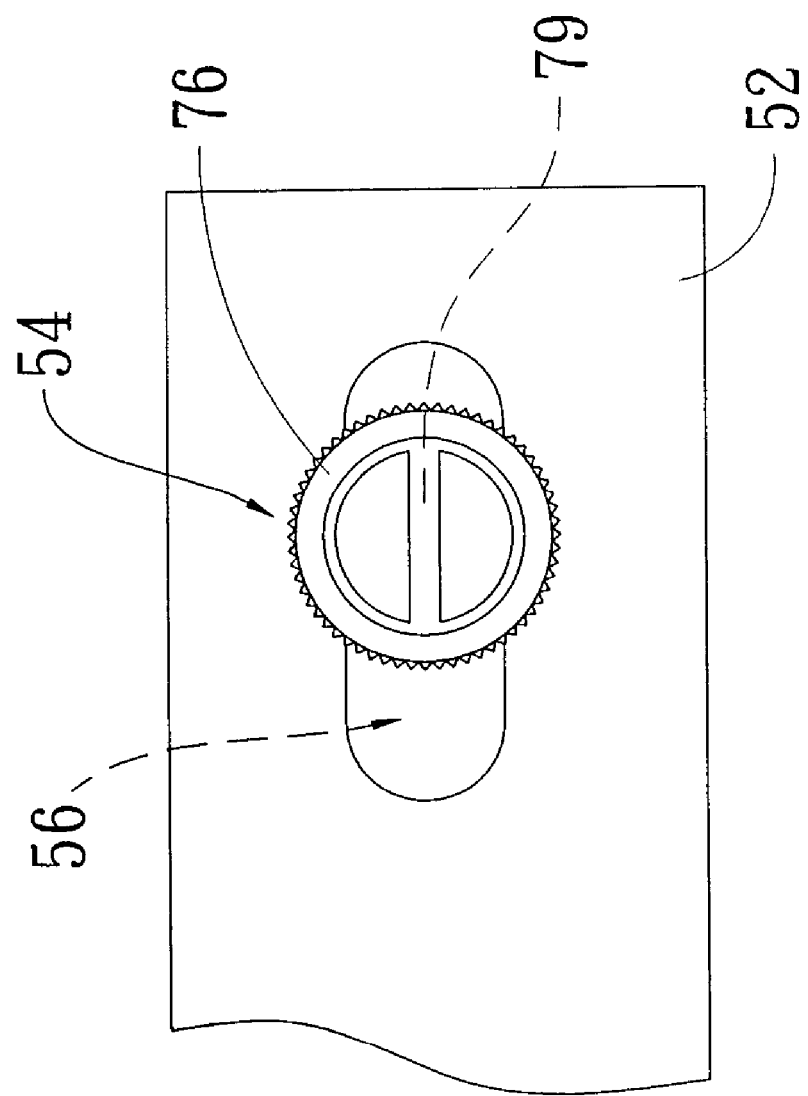
FIG. 5 is a schematic view showing a cover of the present invention from an outer side.

Referring to FIG. 5, the nut 76 and the recess 79 of the screw set 54 outside the cover 52 are shown in the Figure. The nut 76 can be pressed and screwed into the threaded hole 50. The screw set can be also transversely adjusted along the wide opening 56 to be aligned with the threaded hole 50.

Figure 6:
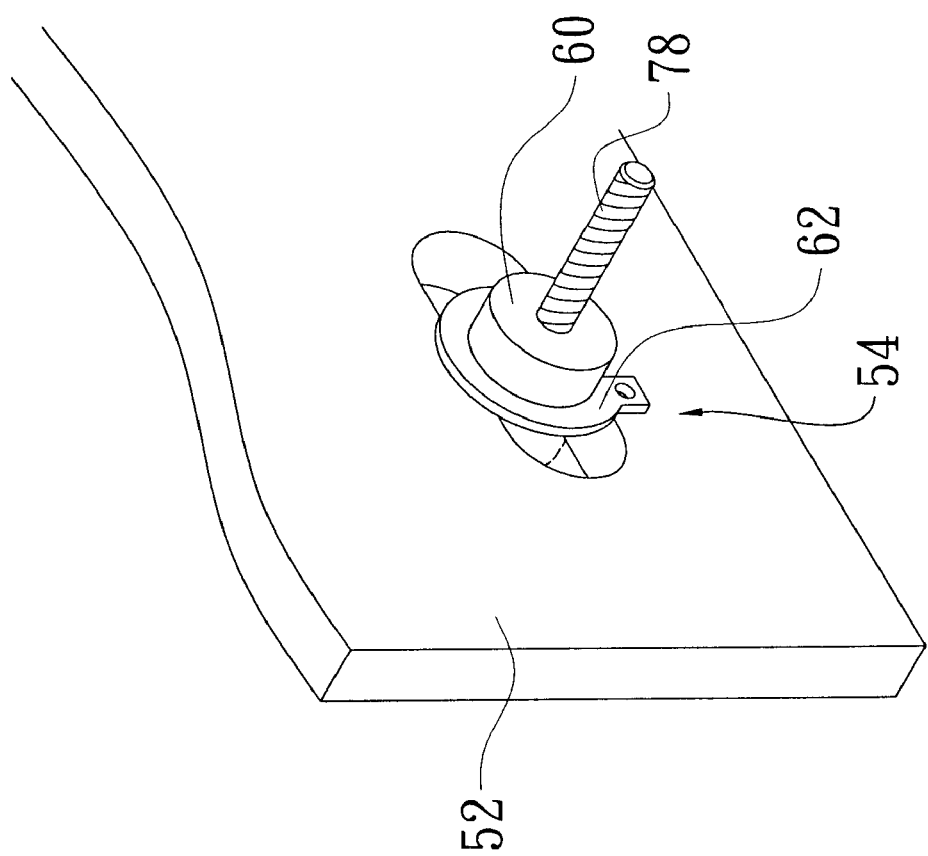
FIG. 6 is schematic view showing the cover of the present invention from an inner side.

Referring to FIG. 6, the screw rod 78 and the retaining component 62 buckled to the sleeve 60 inside the cover 52 are shown in the Figure.

Therefore, by the easy-handling screw set 54 and the cover assembly assembly 44 of the present invention, the cover body 32 and the main body 34 will be easily lifted up and folded and well protected by the cover 52. The wide opening 56 of the cover body 32 will overcome manufacturing error so that the screw sets 54 can be screwed precisely to the threaded holes 50. A quality and handling are improved by the delicate design of the screw set 54.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A cover assembly for an industrial computer with a cover body and main body pivoted to each other being arranged to a front surface of the cover body and being capable of covering a front surface of the main body while the cover body being folded to the main body; the main body having at least one threaded hole; the cover assembly comprising:
a cover being arranged to the front surface of the cover body; the cover having a wide opening opposite to the threaded hole of the main body;
a screw set for the opening further comprising:
a sleeve having a tunnel through a center axis thereof; a stop portion being extended from a surface of the sleeve; the sleeve being placed into the opening and the stop portion being against outside of the cover; a groove being formed to the sleeve in a lower portion beneath the cover;
a retaining component being buckled to the groove for holding the sleeve in the opening; and
a screw set having a nut and a screw rod; a space inside the nut receiving an end of the sleeve outside the cover; the screw rod being connected to an inner surface of the space inside the nut and extending into the cover through the tunnel of the sleeve;
wherein an end of the screw rod passing through the cover will be screwed into the threaded hole of the main body while the cover body is folded to the main body.

2. The cover assembly for an industrial computer as claimed in claim 1, wherein the end of the sleeve outside the panel is enlarged; a rim of the nut is shrunk; the nut will travel along the sleeve until the rim reaches the stop portion of the sleeve.

3. The cover assembly for an industrial computer as claimed in claim 2, wherein the screw set having a spring; the spring is arranged to the inner space of the nut to push against the enlarged end of the sleeve and the inner surface of the nut.

4. The cover assembly for an industrial computer as claimed in claim 1, wherein the nut has a recess on an outer surface thereof.

5. The cover assembly for an industrial computer as claimed in claim 1, wherein the groove is a round groove; the retaining component is a C-ring buckle.

6. The cover assembly for an industrial computer as claimed in claim 1, wherein the wide opening of the cover is one of an oval-shape opening or a rectangular opening.

7. The cover assembly for an industrial computer as claimed in claim 1, wherein a display is arranged to an inner surface of the cover body; the cover assembly is arranged to the front surface of the cover body; the cover assembly will cover the front surfaces of the cover body and the main body and will be screwed to the threaded hole of the main body while the cover body is folded to main body.

8. The cover assembly for an industrial computer as claimed in claim 7, wherein at least one keyboard is arranged to an inner surface of the main body; the cover assembly will cover the front surfaces of the cover body and the main body and will be screwed to the threaded hole of the main body while the cover body is folded to main body.

9. The cover assembly for an industrial computer as claimed in claim 1, wherein the industrial computer is one of a industrial computer main frame or a industrial computer terminal.

* * * * *